United States Patent [19]
Kim

[11] Patent Number: 5,892,467
[45] Date of Patent: Apr. 6, 1999

[54] SIGNAL MODULATION METHOD EMPLOYING MULTILEVEL RUN LENGTH LIMIT CODING SCHEME

[75] Inventor: Myoung-June Kim, Kyungki-do, Rep. of Korea

[73] Assignee: Samsung Electronics Co., Ltd., Suwon, Rep. of Korea

[21] Appl. No.: 898,241

[22] Filed: Jul. 22, 1997

[30] Foreign Application Priority Data

Jul. 23, 1996 [KR] Rep. of Korea .................. 1996-29849

[51] Int. Cl.⁶ ...................................................... H03M 7/00
[52] U.S. Cl. .............................................. 341/59; 341/58
[58] Field of Search ................................ 341/59, 58, 55, 341/56, 106, 95

[56] References Cited

U.S. PATENT DOCUMENTS

| | | | |
|---|---|---|---|
| 4,760,378 | 7/1988 | Iketani et al. | 341/59 |
| 5,400,023 | 3/1995 | Ino et al. | 341/59 |
| 5,532,694 | 7/1996 | Mayers et al. | 341/67 |
| 5,537,112 | 7/1996 | Tsang | 341/59 |
| 5,781,133 | 7/1998 | Tsang | 341/59 |

FOREIGN PATENT DOCUMENTS

| | | |
|---|---|---|
| 0 162 558 A2 | 11/1985 | European Pat. Off. . |
| 0 405 836 A2 | 1/1991 | European Pat. Off. . |
| 2 304 260 | 3/1997 | United Kingdom . |
| 2 305 582 | 4/1997 | United Kingdom . |

*Primary Examiner*—Brian Young
*Assistant Examiner*—Peguy JeanPierre
*Attorney, Agent, or Firm*—Staas & Halsey

[57] ABSTRACT

A signal modulation method used for a digital channel of digital recording media and digital communication. The method includes the steps of (a) receiving data in a first data unit of a first bit length and RLL encoding the received data into a (d,k) code word; and (b) receiving data in a second data unit of a second bit length and RLL encoding the received data if a number of consecutive zeroes is less than d when two codes words encoded in said step (a) are concatenated. Therefore, a higher resolution than that of other modulation codes is achieved, for a minimum time interval, 4T (diffraction limit). The DC component of a modulated code can be suppressed by controlling merging bits.

23 Claims, 1 Drawing Sheet

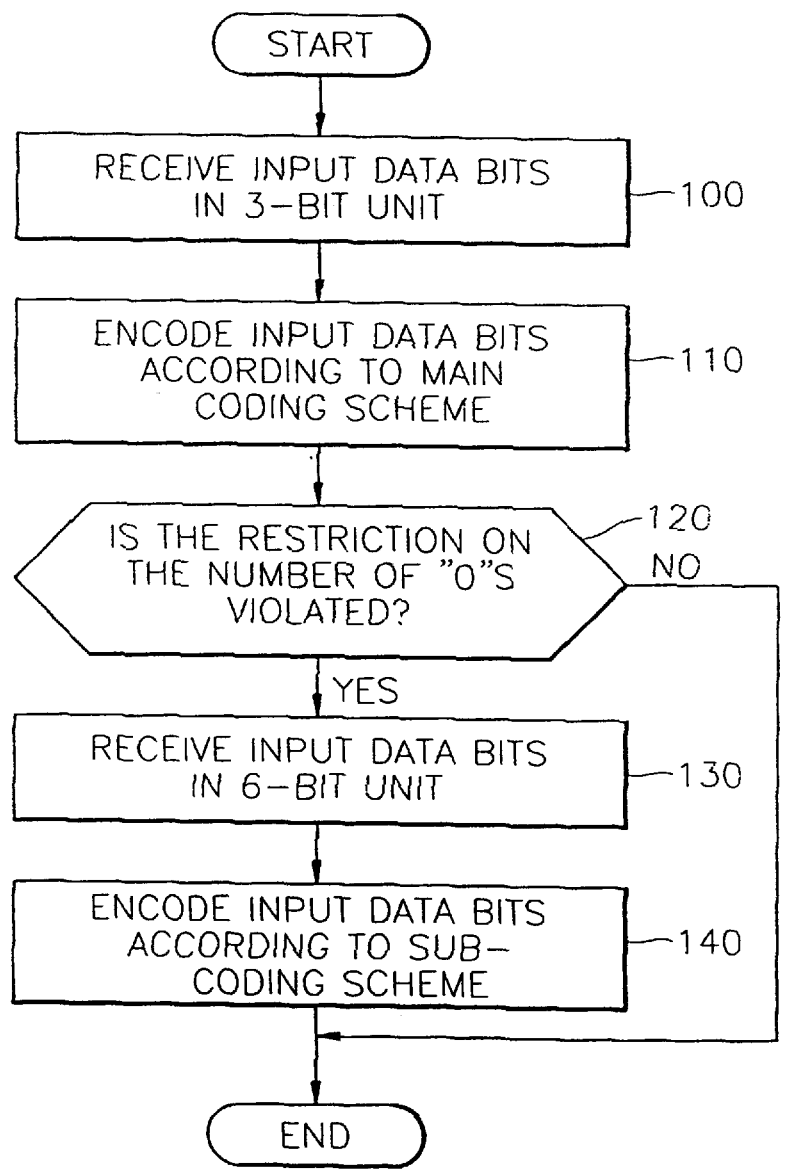

SIGNAL MODULATION METHOD EMPLOYING MULTILEVEL RUN LENGTH LIMIT CODING SCHEME

BACKGROUND OF THE INVENTION

1. Field of the Invention

The present invention relates to a signal modulation method, and more particularly, to a run length limit (RLL) coding method for enhancing the recording density of digital recording media.

2. Description of the Related Art

There are various methods for modulating a signal, during the recording and reproduction of the signal used for digital optical recording media and magnetic recording media. Modified frequency modulation (FM) is a representative modulation method.

Such modulation methods are used for compact disks, first-generation magneto-optical disks, and second-generation re-recordable optical disks. The optical disk modulation method is either a peak detecting method, for detecting the position of a peak, or an edge detecting method for detecting the edge of a mark. Minimum and maximum time intervals between such peaks or edges are critical characteristic values. They determine the resolution which is related to the recording density of a reproduced signal and a jitter margin, and are expressed as the restriction RLL of the number of continuous '0's. Other critical variables which determine the recording density are error propagation, whether the number of input bits is variable, and the ratio of the number of input bits to the number of output bits, namely, the conversion ratio.

RLL (2,7) is a conventional modulation method used for first-generation magneto-optical disks. It has a relatively small jitter margin to be used for the edge detecting method. RLL (1,7) is a method obtained by improving the conventional modulation method. With this method, a large jitter margin can be secured by reducing the size of the minimum mark, and by improving a capacity and the size of a window by 33%. However, the RLL (1,7) modulation method has a problem in that the recording density is relatively low for a given resolution, in the case of optical recording, in which the minimum time interval is 2T and 3T (the diffraction limit).

SUMMARY OF THE INVENTION

An object of the present invention is to provide a signal modulation method for enhancing the recording density of digital recording media.

To achieve the above object, there is provided a signal modulation method comprising the steps of (a) receiving data in a first data unit of a first bit length and RLL encoding the received data into a (d,k) code word; and (b) receiving data in a second data unit of a second bit length and RLL encoding the received data if a number of consecutive zeroes is less than d when two codes words encoded in the step (a) are concatenated. The variable d denotes the minimum number of '0's between two '1's in a sequence and k denotes the maximum number of '0's between two '1's in a sequence.

BRIEF DESCRIPTION OF THE DRAWING

The above and other objects and advantages of the present invention will become more apparent by describing in detail a preferred embodiment thereof with reference to the attached drawing in which:

FIGURE is a flow chart for explaining a signal modulation method according to the present invention.

DETAILED DESCRIPTION OF THE PREFERRED EMBODIMENTS

The present invention employs an RLL (3,15) coding method in which the number of consecutive '0's is limited from 3 to 15.

Also, the signal modulation method of the present embodiment includes two coding schemes: a main conversion coding and a sub-conversion coding.

In the main coding scheme, input data bits are received in 3-bit units to yield 7-bit coded sequences (code words). On the other hand, in the sub-coding scheme, input data bits are received in 6-bit units to yield 14-bit coded sequences.

The code book used in the main coding scheme and the sub-coding scheme of the present embodiment is given in table 1.

TABLE 1

| code book for main coding | |
|---|---|
| input bits | output bits |
| 000 | 1000000 |
| 001 | 0100000 |
| 010 | 0010000 |
| 011 | 0001000 |
| 100 | 0000100 |
| 101 | 0000010 |
| 110 | 1000100 |
| 111 | 1000010 |

| code book for sub-coding | | merging bit(s) determination |
|---|---|---|
| 100 000 | 0000000 1000XXX | |
| 100 110 | 0000001 0000XXX | X = 0 or 1 |
| 100 111 | 0000001 0001000 | XX = 00, 01 or 10 |
| 101 000 | 0000000 01000XX | XXX = 000, 001, 010 |
| 101 001 | 0000000 001000X | or 100 |
| 101 110 | 0010001 0001000 | |
| 101 111 | 0010001 0000XXX | * X is |
| 110 000 | 0100001 0001000 | merging bit(s) |
| 110 110 | 0100001 0000XXX | |
| 110 111 | 0100010 0001000 | |
| 111 000 | 0100010 0000XXX | |
| 111 001 | 0100010 001000X | |
| 111 110 | 1000001 0001000 | |
| 111 111 | 1000001 0000XXX | |

In the table 1, 'X' denotes a merging bit.

Referring to the FIGURE, data is input to an encoder in a 3-bit unit in the present embodiment (step 100). Thus, the input data bits are one of '000', '001', '010', '011', '100', '101', '110' and '111'.

The input data is RLL encoded into (3,15) code of length 7 according to the main coding scheme (step 110).

That is, when the input bits are '000', the output bits are '1000000'. When the input bits are '001', the output bits are '0100000'. When the input bits are '010', the output bits are '0010000'. When the input bits are '011', the output bits are '0001000'. When the input bits are '100', the output bits are '0000100'. When the input bits are '101', the output bits are '0000010'. When the input bits are '110', the output bits are '1000100'. When the input bits are '111', the output bits are '11000010'.

After the 3-bit units (code words) are encoded in such a manner, the next input data bits are received and RLL encoded. Subsequently, the two encoded code words are concatenated.

Afterwards, it is determined whether the number of consecutive "0"s in the concatenated bit sequence is less than the lower limit 3 (step 120).

If it is determined in the step 120 that the number of consecutive "0"s in the concatenated bit sequence is equal to or greater than the lower limit 3, the encoding process for the first input data bits is completed.

On the other hand, if it is determined in the step 120 that the number of consecutive "0"s in the concatenated bit sequence is less than the lower limit 3, the code words for the two 3-bit input data words are invalidated. Also, the two 3-bit input data words are concatenated to be encoded in a 6-bit unit (step 130).

In this embodiment, there are fourteen cases in which the number of consecutive "0"s in the concatenated coded word, which is the result after performance of the main coding scheme and subsequent concatenation of the two resultant 7-bit code words, is less than the lower limit 3. That is, 6-bit data to be encoded as one unit may be '100000', '100110', '100111', '101000', '101001', '101110', '101111', '110000', '110110', '110111', '111000', '111001', '111110', or '111111'.

The 6-bit data is RLL encoded into a (3,15) code of length 14 according to the sub-coding scheme (step 140).

That is, when the input bits are '100000', the output bits are '0000000 1000XXX'. When the input bits are '100110', the output bits are '0000001 0000XXX'. When the input bits are '100111', the output bits are '0000001 0001000'. When the input bits are '101000', the output bits are '0000000 01000XX'. When the input bits are '101001', the output bits are '0000000 001000X'. When the input bits are '101110', the output bits are '0010001 0001000'. When the input bits are '101111', the output bits are '0010001 0000XXX'.

| | |
|---|---|
| X = 0 | if a next code word starts with 100, 010 or 001 |
| 1 | Otherwise |
| XX = 00 | if a next code word starts with 10 or 01 |
| 10 | Otherwise |
| XXX = 000 | if a next code word starts with 1 |
| 100 | Otherwise |

In other words, the merging bit X is "0" when a next code word starts with '100', '010' or '001' and "1" when the next code word does not start with '100', '010' or '001'. The merging bits XX are "00" when the next code word starts with '10' or '01' and "0" when the next code word does not start with '10' or '01'. Also, the merging bits XXX are "000" when the next code word starts with '1' and "100" when the next code word does not start with '1'.

However, according to this second method, a DC content in the modulated signal may be large, which is not desirable considering the frequency response characteristics of the readback system.

A third merging bit determination method which can reduce the DC content in the modulated signal is as follows. The merging bit is determined as "0" or "1", the merging bits XX as "00", "01" or "10", and the merging bits XXX as "000", "001", "010" or "100", when the number of consecutive '0's in the concatenated code word sequence does not exceed 15.

Now, an example of signal modulation according to the embodiment of the present invention is described, in which the third merging bit determining method is employed. It is assumed that the input data bits are '100 111 010 101 111 000 111 111 011 111 111 010 101 000 001 100'. Then, the input data bits are encoded as follows:

| INPUT | 100 111 | 010 | 101 111 | |
|---|---|---|---|---|
| OUTPUT | 00000010001000 | 0010000 | 00100010000XXX | |
| INPUT | 000 | 111 111 | 011 | 111 111 |
| OUTPUT | 1000000 | 10000010000XXX | 0001000 | 10000010000XXX |
| INPUT | 010 | 101 000 | 001 100 | |
| OUTPUT | 0010000 | 000000001000XX | 0100000 0000100 | |

When the input bits are '110000', the output bits are '0100001 0001000'. When the input bits are '110110', the output bits are '0100001 0000XXX'. When the input bits are '110111', the output bits are '0100010 0001000'. When the input bits are '111000', the output bits are '0100010 0000XXX'. When the input bits are '111001', the output bits are '0100010 0010000X'. When the input bits are '111110', the output bits are '1000001 0001000'. When the input bits are '111111', the output bits are '1000001 0000XXX'.

When the encoding of the step 140 is done, the encoding of the next 3- or 6-bit input data bits are carried out, and then the merging bit(s) X are determined.

Next, the methods for determining the merging bit(s)(X) in the sub-coding scheme are described.

The simplest method is to set all the merging bits to zeroes. That is, X, XX and XXX are "0","00" and "000", respectively. However, according to such a method, the requirements on the number of consecutive "0"s may not be satisfied.

One of the methods which is simple while satisfying the requirements on the number of consecutive "0"s is as follows:

First, two 3-bit input data words '100' and '111' are encoded into "0000100," respectively, according to the main coding scheme. Subsequently, the two code words are concatenated to become "0000100 1000010." Since there are only two "0"s between two "1"s in the fifth and the eighth digit, the code words for the two 3-bit input data words are invalidated. Then, a 6-bit input word '100 111' which results from the concatenation of '100' and '111' is encoded into "00000010001000" according to the sub-coding scheme. The code word is accepted because the restriction on the number of "0"s is not violated and there is no possibility that the restriction is violated when the code word is concatenated with a following code word.

Afterwards, the following 3-bit input data words '010' and '101' are encoded into "0010000" and "0000010" according to the main coding scheme. The code word for the input data word '010' is accepted because the restriction on the number of "0"s is not violated when the two code words are concatenated.

Again, the following 3-bit input data words '101' and '111' are encoded into "0000010" and "1000010," respectively, according to the main coding scheme. The code words for the two 3-bit input words are discarded because the restriction on the number of "0"s is violated when the two code words are concatenated. Then, a 6-bit input word '101 111' which results from the concatenation of '101' and '111' is encoded into "00100010000XXX" according to the sub-coding scheme. The code word is accepted because the restriction on the number of "0"s is not violated. However, since there is a possibility that the restriction is violated when the code word is concatenated with a following code word, the code word shall be in a state of pending to fix the merging bits later.

Once again, the following 3-bit input data words '000' and '111' are encoded into "1000000" and "1000010," respectively, according to the main coding scheme. The code word for the input data word '000' is accepted because the restriction on the number of "0"s is not violated when the two code words are concatenated. At this time, the merging bits which are pending are fixed such that restriction on the number of "0"s is not violated. In such a manner, all the input data words are encoded.

Next, how the coded bit sequence is decoded will now be described. In this example, the coded bit sequence which resulted from the encoding example is used in order to verify the logical coincidence of the present invention.

Thus, it is assumed that the input bit sequence at a decoder is "00000010001000 0010000 00100010000XXX 1000000 10000010000XXX 0001000 10000010000XXX 0010000 000000001000XX 0100000 0000100." Then, the input bit sequence is decoded as follows:

| INPUT | 00000010001000 | 0010000 | 00100010000XXX | |
|---|---|---|---|---|
| OUTPUT | 100 111 | 010 | 101 111 | |
| INPUT | 1000000 | 10000010000XXX | 0001000 | 10000010000XXX |
| OUTPUT | 000 | 111 111 | 011 | 111 111 |
| INPUT | 0010000 | 000000001000XX | 0100000 | 0000100 |
| OUTPUT | 010 | 101 000 | 011 | 100 |

First, the decoding of a first seven bits of the encoded bit sequence "0000001" is attempted. However, since the code book for the main coding scheme does not include the code word, an attempt is made to decode a first fourteen bits of the encoded bit sequence "00000010001000." Thus, the code word is decoded into '100 111' according to the sub-coding scheme.

Afterwards, an attempt is made to decode another seven bits of the encoded bit sequence "0010000." Since the code book for the main coding scheme includes the code word "0010000," the code word is decoded into "010."

In such a manner, all the encoded bit sequences are decoded into original data.

Table 2 shows the result of an encoding simulation which was carried out by the inventor, in which arbitrary input data bits numbering about 12,360 bits were modulated. In the table, the time interval (TI) distribution of the modulation codes is shown.

TABLE 2

| runlength (RL) | time interval (TI) | total occurrences | probability |
|---|---|---|---|
| 3 | 4 | 8923 | 0.2532 |
| 4 | 5 | 6611 | 0.1876 |
| 5 | 6 | 5040 | 0.1430 |
| 6 | 7 | 4472 | 0.1269 |
| 7 | 8 | 2980 | 0.0846 |
| 8 | 9 | 2350 | 0.0667 |

TABLE 2-continued

| runlength (RL) | time interval (TI) | total occurrences | probability |
|---|---|---|---|
| 9 | 10 | 1660 | 0.0471 |
| 10 | 11 | 1448 | 0.0411 |
| 11 | 12 | 812 | 0.0230 |
| 12 | 13 | 389 | 0.0110 |
| 13 | 14 | 241 | 0.0068 |
| 14 | 15 | 162 | 0.0046 |
| 15 | 16 | 146 | 0.0041 |
| total | | 35234 | 1.0000 |

It is noted that the distribution probability is low, from the fact that the distribution of the minimum time interval is about 25%.

In the above-mentioned signal modulation method, a resolution which is higher than that of other modulation codes is provided, for optical recording in which the minimum time interval is 4T (the diffraction limit.) Accordingly, information density is high and demodulation is easy.

What is claimed is:

1. A signal modulation method for modulating data, comprising the steps of:

(a) receiving the data in a first data unit of a first bit length and RLL encoding the received data into a (d,k) code word; and (b) receiving the data in a second data unit of a second bit length and RLL encoding the received data if a number of consecutive zeroes is less than d when two code words encoded in said step (a) are concatenated.

2. The signal modulation method as claimed in claim 1, wherein the first bit length is 3 and the received first data unit is encoded according to a following code book in said step (a):

| input bits | output bits |
|---|---|
| 000 | 1000000 |
| 001 | 0100000 |
| 010 | 0010000 |
| 011 | 0001000 |
| 100 | 0000100 |
| 101 | 0000010 |
| 110 | 1000100 |
| 111 | 1000010 |

3. The signal modulation method as claimed in claim 1, wherein said step (b) comprises the steps of:

(b1) concatenating two code words RLL encoded in said step (a);

(b2) determining whether the number of consecutive zeroes in the concatenated code word sequence concatenated in said step (b1) is less than d; and (b3) receiving the data in the second data unit and RLL encoding the received second data unit if the determination is made that the number of consecutive zeroes is less than d in said step (b2).

4. The signal modulation method as claimed in claim 1, wherein the second bit length is 6 and the received second data units are encoded according to a following code book in said step (b3):

| input bits | output bits |
|---|---|
| 100 000 | 0000000 1000XXX |
| 100 110 | 0000001 0000XXX |
| 100 111 | 0000001 0001000 |
| 101 000 | 0000000 01000XX |
| 101 001 | 0000000 001000X |
| 101 110 | 0010001 0001000 |
| 101 111 | 0010001 0000XXX |
| 110 000 | 0100001 0001000 |
| 110 110 | 0100001 0000XXX |
| 110 111 | 0100010 0001000 |
| 111 000 | 0100010 0000XXX |
| 111 001 | 0100010 001000X |
| 111 110 | 1000001 0001000 |
| 111 111 | 1000001 0000XXX | where 'X,' 'XX,' and 'XXX' are merging bits.

5. The signal modulation method as claimed in claim 4, wherein the merging bit 'X' is "0", the merging bits 'XX' are "00", and the merging bits 'XXX' are "000".

6. The signal modulation method as claimed in claim 4, wherein the merging bit X is "0" when a next code word starts with '100', '010' or '001' and "1" when the next code word does not start with '100', '010' or '001', the merging bits XX are "00" when the next code word starts with '10' or '01' and "10" when the next code word does not start with '10' or '01', and the merging bits XXX are "000" when the next code word starts with '1' and "100" when the next code word does not start with '1'.

7. The signal modulation method as claimed in claim 4, wherein the merging bit is "0" or "1", the merging bits XX are "00", "01" or "10", and the merging bits XXX are "000", "001", "010" or "100", when the number of consecutive zeroes in the concatenated code word sequence does not exceed 15.

8. A signal processing method for digital data, comprising the steps of:
(a) receiving the digital data as first data words of a first bit length and encoding two consecutive first data words into corresponding first code words;
(b) concatenating two consecutive first code words into a concatenated code word, determining whether a number of bits of the concatenated code word having the same particular value is at least as great as a predetermined number; and
(c) outputting the code word corresponding to the first of the two consecutive first code words if the number of bits of the concatenated code word having the same particular value is at least as great as the predetermined number, and receiving the digital data as second data words of a second bit length and encoding one of the second data words into a second code word, and outputting the second code word, if the number of bits of the concatenated code word having the same particular value is less than the predetermined number.

9. A signal processing method as claimed in claim 8, wherein the first code words comprise a first number of bits and the second code word comprises a second number of bits different than said first number of bits.

10. A signal processing method as claimed in claim 8, wherein each of the second data words comprises two consecutive first data words concatenated together.

11. A signal processing method as claimed in claim 10, wherein each first data word comprises 3 bits, each first code word comprises 7 bits, each second data word comprises 6 bits, and each second code word comprises 14 bits.

12. A signal processing method as claimed in claim 10, further comprising the steps of:
(d) encoding a next first data word into a next first code word, concatenating the second of the two consecutive first code words with the next first code word into a next concatenated code word and repeating said step (c) if the number of consecutive zeroes for the concatenated code word is at least as great as the predetermined number; and
(e) encoding a next two consecutive first data words into corresponding next first code words, concatenating the next first code words into the next concatenated code word and repeating said step (c) if the number of consecutive zeroes of the concatenated code word is less than the predetermined number.

13. A signal processing method as claimed in claim 10, further comprising the steps of:
(d) comparing a first number of bits output in said step (c) and determining whether the first number of bits matches one of a plurality of codes of a code book;
(e) decoding the first number of bits based upon the one code of the code book if the first plurality of bits matches the one code of the code book; and
(f) comparing a second number of bits output in said output in said step (c) if the first predetermined number of bits do not match any of the codes of the code book, and then decoding the second number of bits by matching the second number of bits with another one of the plurality of codes of the code book.

14. A signal processing method as claimed in claim 8, further comprising the steps of:
(d) encoding a next first data word into a next first code word, concatenating the second of the two consecutive first code words with the next first code word into a next concatenated code word and repeating said step (c) if the number of consecutive zeroes for the concatenated code word is at least as great as the predetermined number; and
(e) encoding a next two consecutive first data words into corresponding next first code words, concatenating the next first code words into the next concatenated code word and repeating said step (c) if the number of consecutive zeroes of the concatenated code word is less than the predetermined number.

15. A signal processing method as claimed in claim 14, wherein at least one of the least significant bits of the second code word are merging bits which are preset.

16. A signal processing method as claimed in claim 14, wherein at least one of the least significant bits of the second code word are merging bits which are set based upon at least one of the most significant bits of a next first code word.

17. A signal processing method as claimed in claim 14, wherein at least one of the least significant bits of the second code word are merging bits which remain pending until a following code word is determined, and is set so as to ensure that the number of consecutive zeroes of the second code word and the following code word are at least as great as the predetermined number.

18. A signal processing method as claimed in claim 14, further comprising the steps of:
(f) comparing a first number of bits output in said step (c) and determining whether the first number of bits matches one of a plurality of codes of a code book;
(g) decoding the first number of bits based upon the one code of the code book if the first plurality of bits matches the one code of the code book; and (h) comparing a second number of bits output in said step (c) if the first predetermined number of bits do not match any of the codes of the code book, and then decoding the second number of bits by matching the second number of bits with another one of the plurality of codes of the code book.

19. A signal processing method as claimed in claim 8, wherein at least one of the least significant bits of the second code word are merging bits which are preset.

20. A signal processing method as claimed in claim 8, wherein at least one of the least significant bits of the second code word are merging bits which are set based upon at least one of the most significant bits of a next first code word.

21. A signal processing method as claimed in claim 8, wherein at least one of the least significant bits of the second code word are merging bits which remain pending until a following code word is determined, and is set so as to ensure that the number of consecutive zeroes of the second code word and the following code word are at least as great as the predetermined number.

22. A signal processing method as claimed in claim 8, further comprising the steps of:
(d) comparing a first number of bits output in said step (c) and determining whether the first number of bits matches one of a plurality of codes of a code book;
(e) decoding the first number of bits based upon the one code of the code book if the first plurality of bits matches the one code of the code book; and
(f) comparing a second number of bits output in said step (c) if the first predetermined number of bits do not match any of the codes of the code book, and then decoding the second number of bits by matching the second number of bits with another one of the plurality of codes of the code book.

23. A signal processing method for digital data, comprising the steps of:
(a) encoding first and second data words of the digital data having a first data length into corresponding first code words based upon a first coding scheme;
(b) concatenating the corresponding code words and determining whether a number of consecutive bits having a same value in the concatenated code word is at least as great as a predetermined number; and
(c) concatenating the first and second data words into a third data word having a second data length and encoding the third data word into a second code word if the number of bits having the same value in the concatenated code word is at least as great as the predetermined number.

* * * * *

UNITED STATES PATENT AND TRADEMARK OFFICE
CERTIFICATE OF CORRECTION

PATENT NO. : 5,892,467
DATED : April 6, 1999
INVENTOR(S) : Myoung-June KIM

It is certified that error appears in the above-identified patent and that said Letters Patent is hereby corrected as shown below:

Column 2, line 63     "'11000010'" should be --'1000010'--.

Signed and Sealed this

Twenty-fourth Day of August, 1999

Attest:

Q. TODD DICKINSON

*Attesting Officer*     *Acting Commissioner of Patents and Trademarks*